United States Patent
Mori et al.

(10) Patent No.: US 7,916,216 B2
(45) Date of Patent: Mar. 29, 2011

(54) COMPOSITE SIGNAL ANALOG-TO-DIGITAL CONVERTING DEVICE

(75) Inventors: Yuji Mori, Kawasaki (JP); Yoshihiro Nishioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1205 days.

(21) Appl. No.: 11/515,944

(22) Filed: Sep. 6, 2006

(65) Prior Publication Data
US 2007/0222893 A1 Sep. 27, 2007

(30) Foreign Application Priority Data
Mar. 27, 2006 (JP) .................. 2006-085309

(51) Int. Cl.
*H03M 1/12* (2006.01)
(52) U.S. Cl. ......... 348/572; 348/537; 348/505; 348/506
(58) Field of Classification Search .................. 348/572, 348/573, 536, 537, 505, 506; 341/155
See application file for complete search history.

(56) References Cited

U.S. PATENT DOCUMENTS
5,142,377 A * 8/1992 Moriyama et al. ................ 386/2

FOREIGN PATENT DOCUMENTS
| JP | 62-102683 A | 5/1987 |
| JP | 1-256884 A | 10/1989 |
| JP | 2-063397 A | 3/1990 |
| JP | 2002-305670 A | 10/2002 |
| JP | 2005-080026 A | 3/2005 |

OTHER PUBLICATIONS

Patent Abstract of Japan; Japanese Patent Abstract No. 63-081517; Publication date Apr. 12, 1988.
Patent Abstract of Japan; Japanese Patent Abstract No. 06-282349; Publication date Oct. 7, 1994.
Japanese Office Action, Partial English-language translation, issued on Nov. 16, 2010 for corresponding Japanese Application No. 2006-085309.

* cited by examiner

*Primary Examiner* — Jefferey Harold
*Assistant Examiner* — Jean W Désir
(74) *Attorney, Agent, or Firm* — Fujitsu Patent Center

(57) ABSTRACT

A video signal converting device is capable of converting an analog composite signal into a proper digital signal with a small delay even if the analog composite signal contains much jitter. The video signal converting device has a sampling clock output unit for outputting a sampling clock signal having a frequency which is 4n times the frequency of a burst signal contained in the analog composite signal (n represents a positive integer of 2 or greater), and an analog-to-digital converting unit for converting the analog composite signal into a digital signal based on the sampling clock signal output from the sampling clock output unit.

2 Claims, 12 Drawing Sheets

FIG. 4

| SAMPLE NUMBER | 768 | 782 | 783 | 784 | 785 | 786 | 787 | 849 | 850 | 851 | 852 | 853 | 854 | 857 | 858 | 859 | 860 | 861 | 862 | 863 | 864 | 865 | 866 | 867 | 868 | 869 | 870 | 871 | 872 |
|---|---|---|---|---|---|---|---|---|---|---|---|---|---|---|---|---|---|---|---|---|---|---|---|---|---|---|---|---|---|
| BURST PHASE 0° | 0F0 | 0F0 | 0E9 | 0A4 | 044 | 011 | 010 | | 010 | 017 | 05C | 0BC | 0EF | 0F0 | 0F0 | 0DC | 0D6 | 12C | 096 | 0B3 | 14E | 12D | 092 | 0B3 | 14E | 12D | 092 | 0B3 | |
| BURST PHASE 180° | 0F0 | 0F0 | 0E9 | 0A4 | 044 | 011 | 010 | | 010 | 017 | 05C | 0BC | 0EF | 0F0 | 0F0 | 0EC | 104 | 10A | 0B4 | 123 | 0BD | 14A | 12D | 092 | 0B3 | 14E | 12D | 092 | 0B3 | 12D |

| SAMPLE NUMBER | 873 | 874 | 875 | 876 | 877 | 878 | 879 | 880 | 881 | 882 | 883 | 884 | 885 | 886 | 887 | 888 | 889 | 890 | 891 | 892 | 893 | 894 | 895 | 896 | 897 | 898 | 899 | 900 | 909 |
|---|---|---|---|---|---|---|---|---|---|---|---|---|---|---|---|---|---|---|---|---|---|---|---|---|---|---|---|---|---|
| BURST PHASE 0° | 14E | 12D | 092 | 0B3 | 14E | 12D | 092 | 083 | 14E | 12D | 092 | 0B3 | 14E | 12D | 092 | 0B3 | 14E | 12D | 092 | 0B3 | 14E | 129 | 0A6 | 0CD | 112 | 0FA | 0EC | 0F0 | 0F0 |
| BURST PHASE 180° | 092 | 0B3 | 14E | 12D | 092 | 0B3 | 14E | 12D | 092 | 0B3 | 14E | 12D | 092 | 0B3 | 14E | 12D | 092 | 0B3 | 14E | 12D | 092 | 0B7 | 13A | 113 | 0CE | 0E6 | 0F4 | 0F0 | 0F0 |

COMPOSITE SIGNAL ANALOG-TO-DIGITAL CONVERTING DEVICE

CROSS-REFERENCE TO RELATED APPLICATIONS

This application is based upon and claims the benefits of priority from the prior Japanese Patent Application No. 2006-085309, filed on Mar. 27, 2006, the entire contents of which are incorporated herein by reference.

BACKGROUND OF THE INVENTION (1) Field of the Invention

The present invention relates to a video signal converting device, and more particularly to a video signal converting device for converting an analog composite signal into a digital signal.

(2) Description of the Related Art

As efforts have been made in recent years to realize digital TV broadcasts, video signals are undergoing a transition from analog signals to digital signals. Therefore, a growing number of video devices have an interface compatible with digital signals.

Until all video devices are shifted to digital video devices, however, presently prevalent analog NTSC (National Television System Committee) signals still remain in use, and digital video devices need to have a device for converting an NTSC signal into a digital composite video signal (D2 signal).

For converting an NTSC signal into a D2 signal, a color burst signal (fsc=3.579545 MHz) is extracted from the NTSC signal, and the frequency of the color burst signal is quadruplicated (4 fsc=14.31818 MHz). Then, the NTSC signal is sampled at the quadruplicated frequency of the color burst signal, producing a D2 signal.

There has been proposed a sampling clock generator for multiplying the frequency of a clock signal that is in synchronism with a synchronizing signal such as a horizontal synchronizing signal that is applied from an external source, and thereafter frequency-dividing the resultant signal into a frequency-divided clock signal whose reference phase depends on a positive-going edge or a negative-going edge of the synchronizing signal. The proposed sample clock generator has a delay circuit which is not required to be adjusted, and hence can be mass-produced. For details, reference should be made to Japanese laid-open patent publication No. 63-81517, for example.

Another sampling clock generator for automatically making adjustments to bring a reference clock signal into phase with a video signal has also been proposed. For details, reference should be made to Japanese Unexamined patent publication No. 6-282349, for example.

However, if the analog composite signal to be converted contains much jitter, then since the cycle time of a one-line period of the analog composite signal varies, the sampling phase of a digital signal in the one-line period also varies. Therefore, the analog composite signal cannot be converted into a proper digital signal.

SUMMARY OF THE INVENTION

It is an object of the present invention to provide a video signal converting device for converting an analog composite signal into a proper digital signal with a small delay even if the analog composite signal contains much jitter.

To achieve the above object, there is provided a video signal converting device for converting an analog composite signal into a digital signal. The video signal converting device has sampling clock output unit for outputting a sampling clock signal having a frequency which is 4n times the frequency of a burst signal contained in the analog composite signal (n represents a positive integer of 2 or greater), and analog-to-digital converter for converting the analog composite signal into a digital signal based on the sampling clock signal.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 is a diagram showing the positions and values of 10-bit samples in the digital blanking period.

DESCRIPTION OF THE PREFERRED EMBODIMENTS

The principles of the present invention will first be described in detail below with reference to the drawings.

Figure 1:
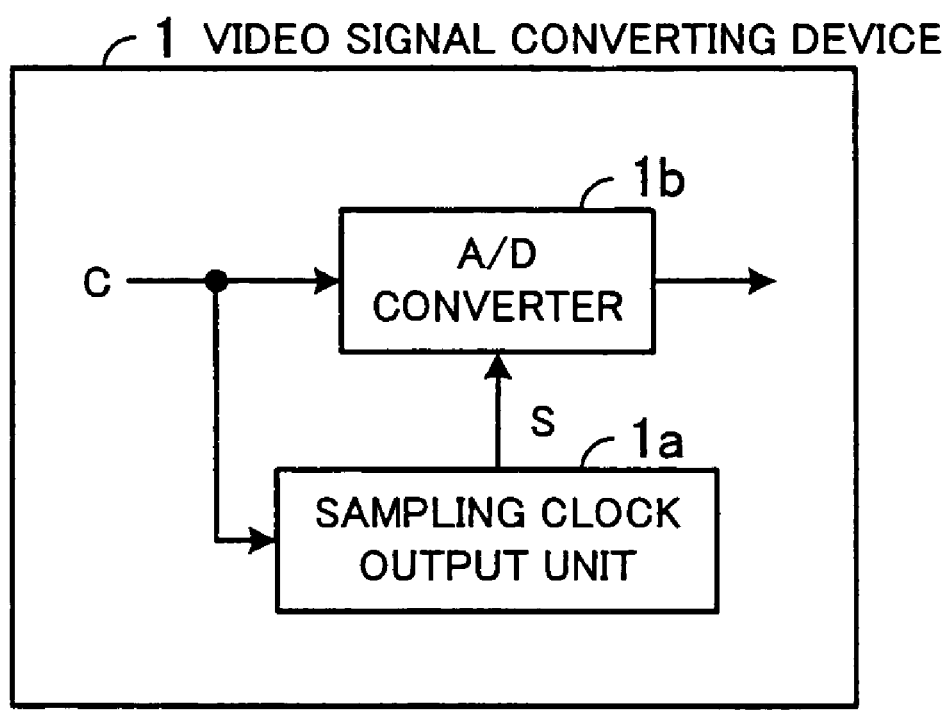
FIG. 1 is a block diagram showing a general arrangement of a video signal converting device according to the present invention.

FIG. 1 shows in block form a general arrangement of a video signal converting device 1 according to the present invention. As shown in FIG. 1, the video signal converting device 1 has a sampling clock output unit 1a and an A/D converter 1b.

The sampling clock output unit 1a outputs a sampling clock signal S which is produced by multiplying the frequency of a burst signal contained in an analog composite signal C by 4n where n represents a positive integer of 2 or greater.

The A/D converter 1b converts the analog composite signal C into a digital signal based on the sampling clock signal S that is output from the sampling clock output unit 1a.

Even if the cycle time of a one-line period of the analog composite signal varies due to jitter, varying the sampling phase, since the analog composite signal C is sampled at the frequency which is n times the conventional frequency, it is possible to provide a proper sampling phase in every one-line period. Therefore, the analog composite signal C can be converted into a proper digital signal with a small delay.

An embodiment of the present invention will be described in detail below with reference to the drawings. Prior to describing a video signal converting device, sampling positions and values according to the SMPTE (Society of Motion Picture and Television Engineers) 244M standards will first be described below.

Figure 2:
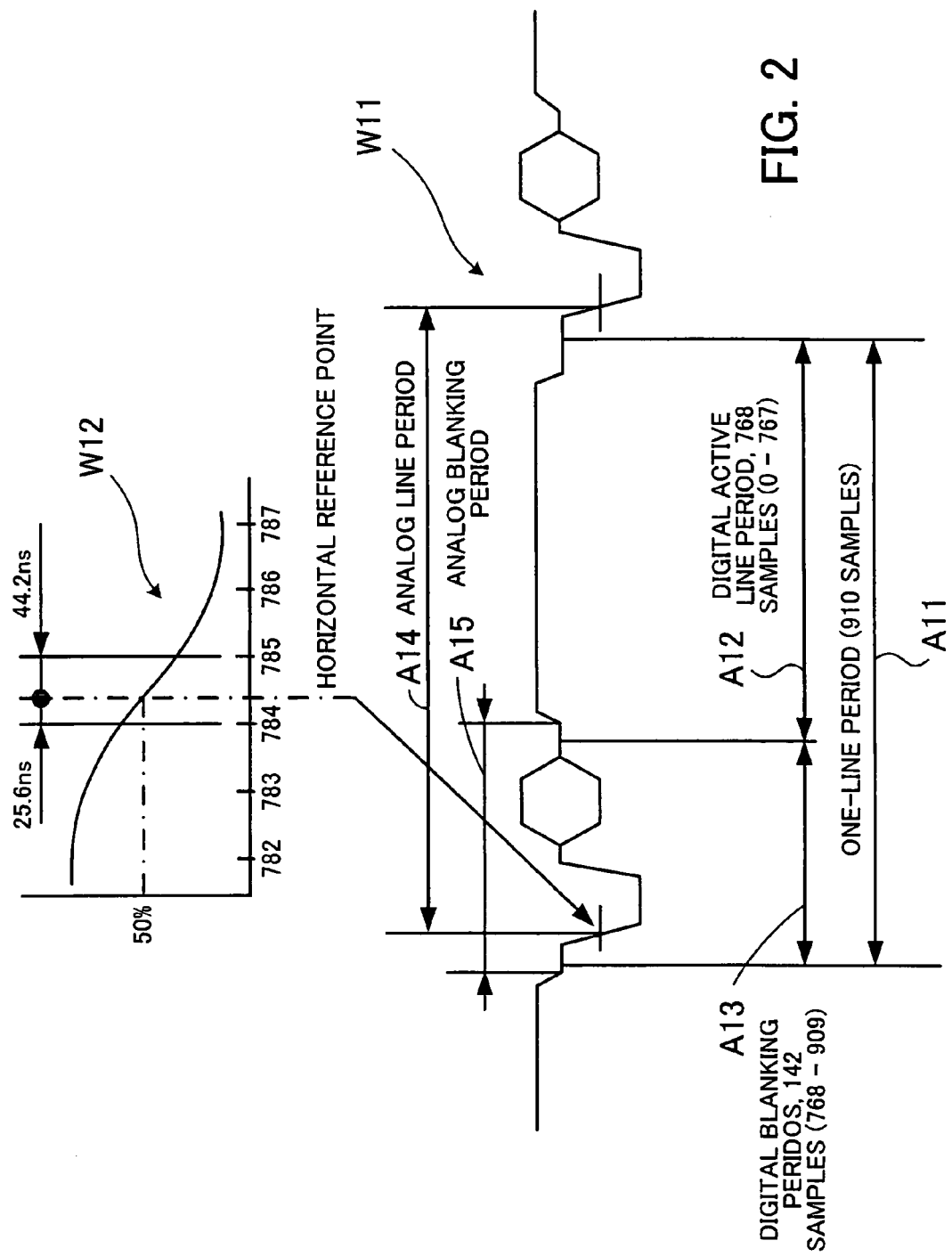
FIG. 2 is a diagram illustrating a horizontal line and sample numbers of an NTSC signal.

FIG. 2 is illustrative of a horizontal line and sample numbers of an NTSC signal. In FIG. 2, the horizontal line of the NTSC signal is shown as indicated by a waveform W11 in a lower portion of FIG. 2. A negative-going edge of a horizontal synchronizing signal of the waveform W11 is shown at an enlarged scale as indicated by a waveform W12 in an upper portion of FIG. 2.

As indicated by the doubled-headed arrow A11 in FIG. 2, one period of the horizontal line of the NTSC signal is referred to as a one-line period. The one-line period contains 910 samples. In other words, an analog NTSC signal of one line is sampled as 910 digital values.

The one-line period is divided into a digital active line period and a digital blanking period as indicated by the doubled-headed arrows A12, A13, respectively. The digital active line period contains 768 samples that are indicated respectively by sample numbers 0 through 767. The digital blanking period contains 142 samples that are indicated respectively by sample numbers 768 through 909. In FIG. 2, a period indicated by the doubled-headed arrow A14 is referred to as an analog line period, and a period indicated by the doubled-headed arrow A15 as an analog blanking period.

As indicated by the waveform W12, a position where the value of the horizontal synchronizing signal is 50% is referred to as a horizontal reference point. According to the STPTE 244M standards, the sampling period of the D2 signal is determined such that the horizontal reference point is positioned between the sample numbers 784, 785.

Details of the digital blanking period indicated by the doubled-headed arrow A13 will be described below.

Figure 3:
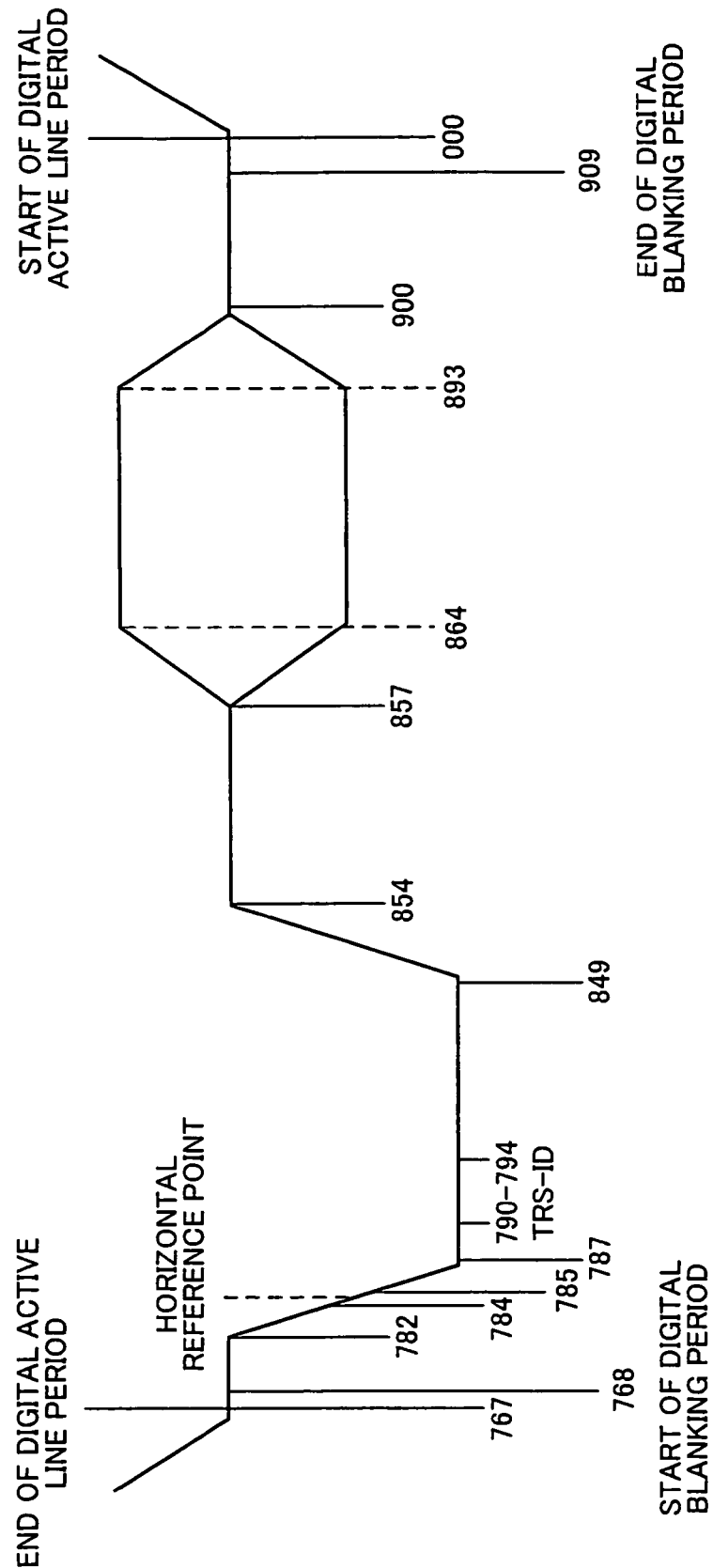
FIG. 3 is a diagram illustrating details of a digital blanking period.

FIG. 3 illustrates details of the digital blanking period. As shown in FIG. 3, the sample numbers in the digital blanking period range from 768 to 909. The sample number 909 is followed by a sample number 000 where a next digital active line period starts. The preceding digital active line period ends with the sample number 767, and the digital blanking period starts with the sample number 768. The horizontal reference point is positioned between the sample numbers 784, 785.

As shown in FIG. 3, the sample numbers 790 through 794 contain a TRS (Timing Reference Signal)-ID. The TRS-ID comprises a timing reference signal and a line number, and includes timing and synchronization information.

FIG. 4 shows the positions and values of 10-bit samples in the digital blanking period. Specifically, FIG. 4 shows sampled values (ideal values) of the NTSC signal ranging from the sample number 778 to the sample number 909 according to the SMPTE 244M standards. Since the burst signal changes its phase to 0 and 180 degrees for odd-numbered lines and even-numbered lines, FIG. 4 shows sampled values of the burst signal both when its phase is 0 degree and when its phase is 180 degrees.

It can be seen from FIG. 4 that sampled values of the sample number 784, for example, are 0A4 (HEX) both when the phase of the burst signal is 0 degree and when the phase of the burst signal is 180 degrees.

Details of the video signal converting device according to the present invention will be described below.

Figure 5:
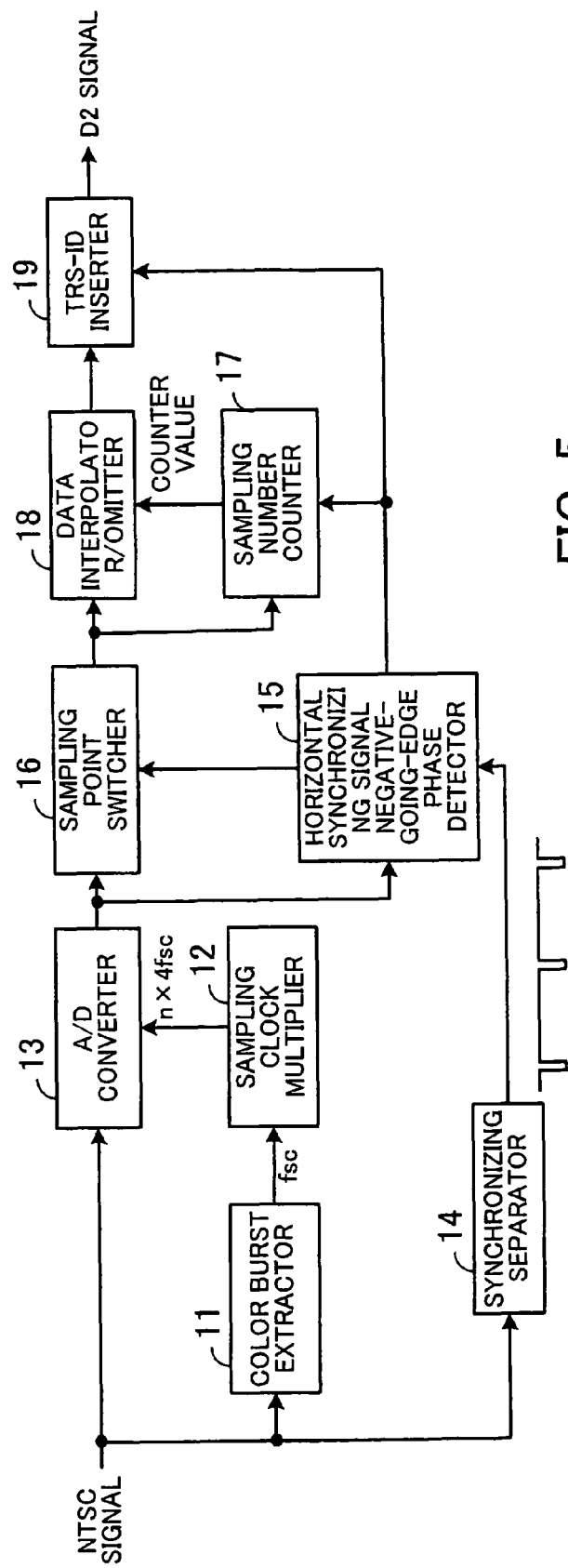
FIG. 5 is a detailed block diagram of the video signal converting device.

FIG. 5 shows in detailed block form the video signal converting device according to the present invention. As shown in FIG. 5, the video signal converting device is supplied with an analog NTSC signal, converts the supplied analog NTSC signal into a digital composite video signal as a D2 signal, and outputs the D2 signal. The video signal converting device has a color burst extractor 11, a sampling clock multiplier 12, an A/D converter 13, a synchronizing separator 14, a horizontal synchronizing signal negative-going-edge phase detector 15, a sampling point switcher 16, a sampling number counter 17, a data interpolator/omitter 18, and a TRS-ID inserter 19.

The color burst extractor 11 extracts a color burst signal from the analog NTSC signal and generates a clock signal (sampling clock signal) in synchronism with the color burst signal. The color burst signal has a frequency fsc=3.579545 MHz. The color burst extractor 11 generates a clock signal in synchronism with the color burst signal having the frequency fsc=3.579545 MHz.

The sampling clock multiplier 12 quadruplicates the frequency fsc of the clock signal output from the color burst extractor 11, then multiplies the resultant frequency by n, and outputs the multiplied-frequency clock signal to the A/D converter 13. Therefore, the sampling clock multiplier 12 outputs the clock signal having the frequency n×4 fsc to the A/D converter 13 where n represents a positive integer of 2 or greater.

The A/D converter 13 converts the analog NTSC signal into a digital video signal in synchronism with the clock signal output from the sampling clock multiplier 12. Specifically, the A/D converter 13 samples the NTSC signal at the frequency n×4 fsc to convert the analog NTSC signal into a digital video signal. Heretofore, the analog NTSC signal has been converted into a digital video signal at a sampling frequency 4 fsc.

The synchronizing separator 14 extracts a horizontal synchronizing signal from the NTSC signal, and outputs the extracted horizontal synchronizing signal to the horizontal synchronizing signal negative-going-edge phase detector 15.

The horizontal synchronizing signal negative-going-edge phase detector 15 is supplied with the digital values of the NTSC signal output from the A/D converter 13 and the horizontal synchronizing signal extracted by the synchronizing separator 14. Based on the horizontal synchronizing signal, the horizontal synchronizing signal negative-going-edge phase detector 15 compares the digital values of the NTSC signal with the ideal value according to the SMPTE 244M standards at the horizontal reference point. Specifically, the horizontal synchronizing signal negative-going-edge phase detector 15 compares the digital values of the NTSC signal at a negative-going edge of the horizontal synchronizing signal with the ideal value according to the SMPTE 244M standards at the horizontal reference point. Depending on the result of the comparison, the horizontal synchronizing signal negative-going-edge phase detector 15 determines a reference sampling point (sampling phase) and sends the determined sampling phase to the sampling point switcher 16.

For example, the horizontal synchronizing signal negative-going-edge phase detector 15 compares the digital values of the NTSC signal at a negative-going edge of the horizontal synchronizing signal with 0A4 (HEX) (the sample value of the sample number 784). The horizontal synchronizing signal negative-going-edge phase detector 15 searches for a digital value which is the closest to (or identical to) 0A4 (HEX) through the comparison, and determines the sampling phase of the digital value as a reference sampling phase. Therefore, the horizontal synchronizing signal negative-going-edge phase detector 15 determines a sampling phase of the digital value for the sampling number 784, and sends the determined sampling phase to the sampling point switcher 16.

The sampling point switcher 16 has been supplied with the digital values of the NTSC signal which have been converted by the A/D converter 13. Since the digital values of the NTSC signal have been sampled at the frequency n×4 fsc, the number of samples in the one-line period is greater than the number of 910 samples according to the SMPTE 244M standards. For example, if the NTSC signal is sampled by a clock signal having a frequency which is five times the frequency 4 fsc, then sampled data that are five times 910 samples are generated.

The sampling point switcher 16 extracts every n digital values from the sampling phase (sample number 784) determined by the horizontal synchronizing signal negative-going-edge phase detector 15, and outputs the extracted digital values. Accordingly, the sampling point switcher 16 outputs digital values of 910 samples in the one-line period according to the SMPTE 244M standards.

Sampling timings of an NTSC signal and determination of a sampling phase will be described below.

Figure 6A:
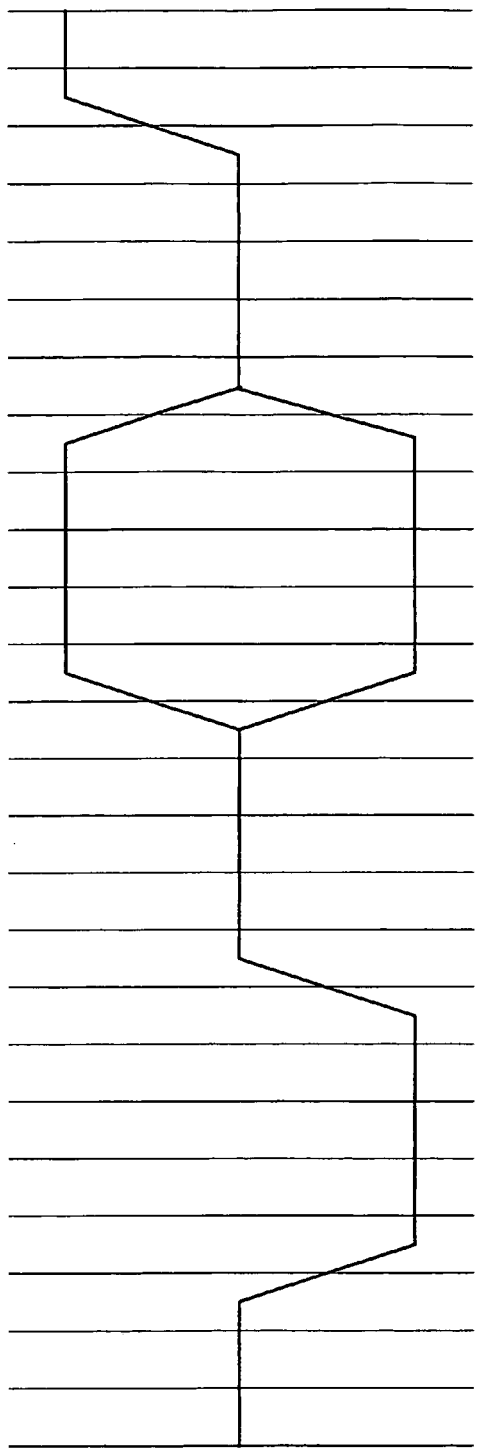
FIGS. 6A and 6B are diagrams showing sampling timings of an NTSC signal.
Figure 6B:
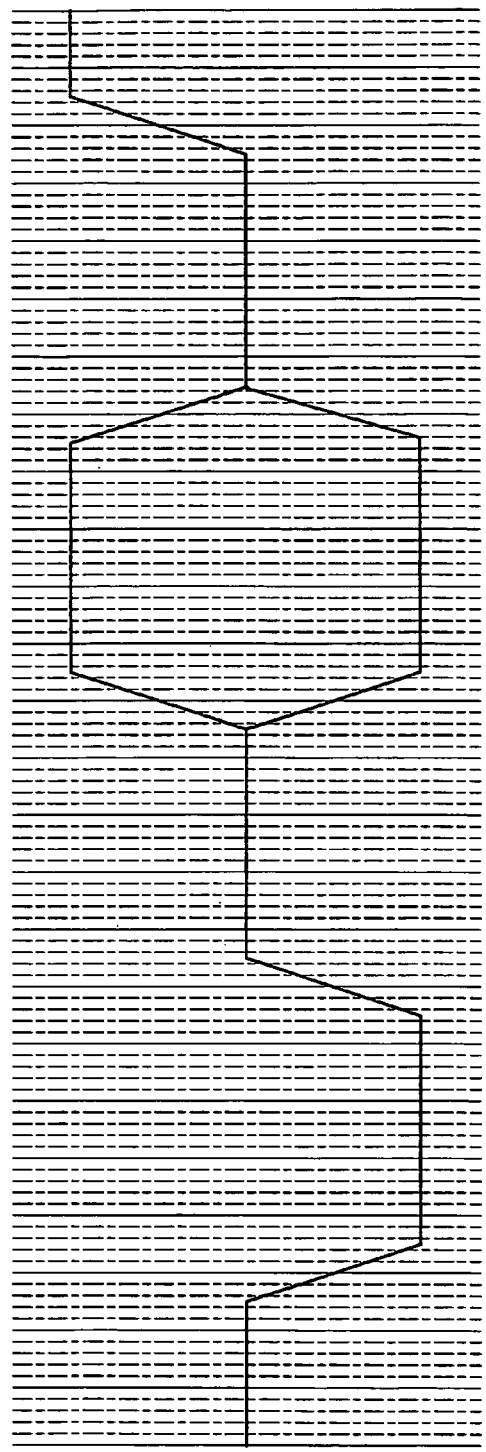

FIGS. 6A and 6B are diagrams showing sampling timings of an NTSC signal. FIG. 6A shows sampling timings at the time the NTSC signal is sampled at the frequency 4 fsc. The vertical solid lines of FIG. 6A represent the sampling timings for the NTSC signal. The sampling timings shown in FIG. 6A represent conventional sampling timings.

FIG. 6B shows sampling timings at the time the NTSC signal is sampled at the frequency 5×4 fsc. The vertical solid lines and dot-dash lines in FIG. 6B represent the sampling timings at the frequency 5×4 fsc for the NTSC signal, and the vertical solid lines represent the sampling timings at the frequency 4 fsc which are the same as those shown in FIG. 6A.

The sampling timings shown in FIGS. 6A and 6B are shown for illustrative purpose only, and do not match an actual sampling scale.

Figure 7A:
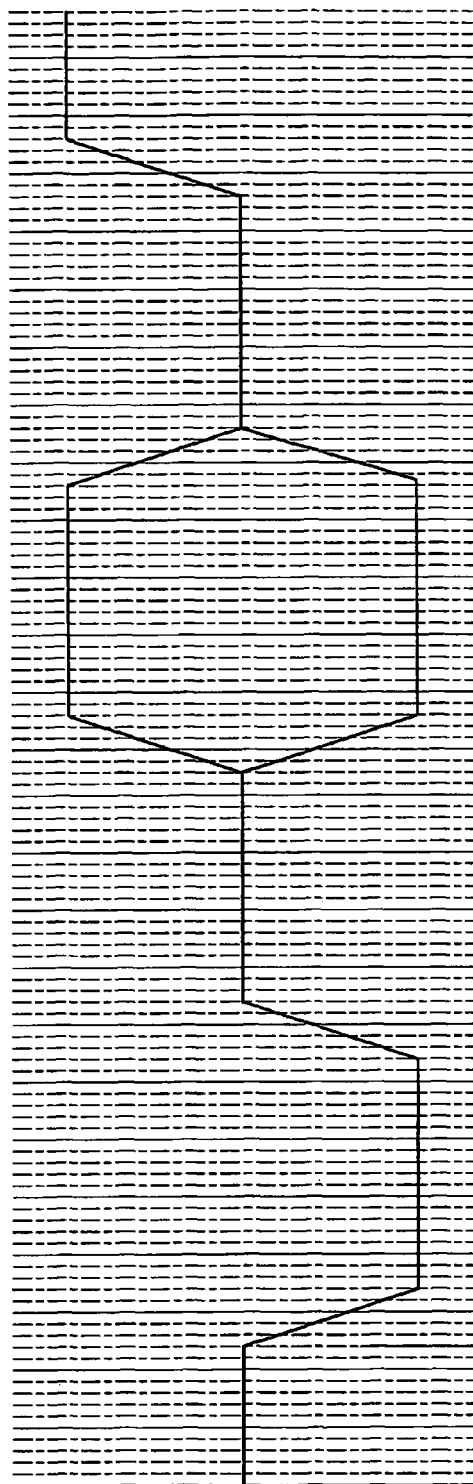
FIGS. 7A and 7B are diagrams illustrating how to determine a sampling phase.
Figure 7B:
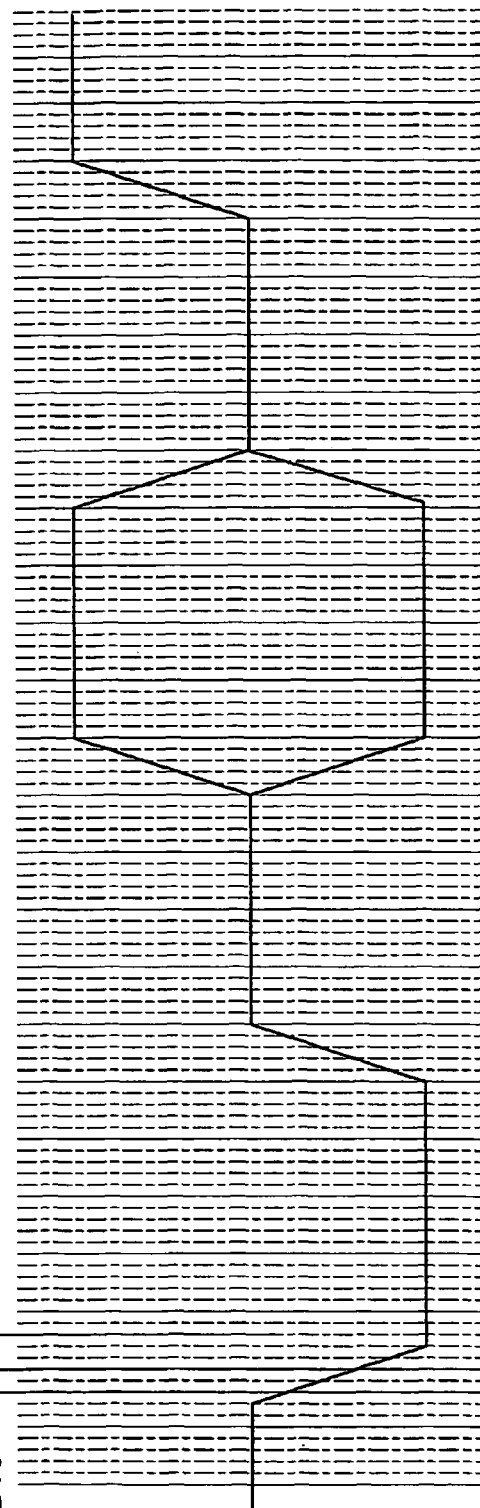

FIGS. 7A and 7B are diagrams illustrating how to determine a sampling phase. FIG. 7A shows sampling timings at the time the NTSC signal is sampled at the frequency 5×4 fsc. FIG. 7B shows sampling timings at the time the NTSC signal is shifted in phase due to jitter. In FIGS. 7A and 7B, the vertical solid lines represent the sampling timings at the frequency 4 fsc, and the vertical solid lines and dot-dash lines represent the sampling timings at the frequency 5×4 fsc.

The horizontal synchronizing signal negative-going-edge phase detector 15 shown in FIG. 5 determines a sampling timing where the digital value is the closest to 0A4 (HEX) as a reference sampling phase. In FIG. 7A, the horizontal synchronizing signal negative-going-edge phase detector 15 determines a sampling timing represented by a vertical straight line B11 as a reference sampling phase. The sampling point switcher 16 extracts every five digital values from the sampling phase (straight line B11) determined by the horizontal synchronizing signal negative-going-edge phase detector 15, and outputs the extracted digital values. Accordingly, the sampling point switcher 16 outputs digital values of the NTSC signal at the timings represented by the vertical solid lines while decimating digital values at the timings represented by the dot-and-dash lines in FIG. 7A.

It is assumed that the NTSC signal is shifted in phase due to jitter, as shown in FIG. 7B. The horizontal synchronizing signal negative-going-edge phase detector 15 determines a sampling timing represented by a vertical straight line B12 as a reference sampling phase. Since the horizontal synchronizing signal negative-going-edge phase detector 15 compares the digital values sampled at the frequency which is five times the frequency 4 fsc, with 0A4 (HEX) to determine a sampling phase, the sampling phase is determined with a level of accuracy which is five times the level of accuracy that has been possible heretofore.

The sampling point switcher 16 extracts every five digital values from the sampling phase (straight line B12) determined by the horizontal synchronizing signal negative-going-edge phase detector 15, and outputs the extracted digital values. Stated otherwise, the sampling point switcher 16 outputs digital values of the NTSC signal at the timings represented by the vertical solid lines in FIG. 7B.

Heretofore, even if the NTSC signal is shifted in phase due to jitter as shown in FIG. 7B, the NTSC signal is sampled at the frequency 4 fsc. Therefore, sampling phases close to 0A4 (HEX) have been detected only at the timings represented by the vertical solid lines in FIG. 7A. In the illustrated example, a sampling phase close to 0A4 (HEX) has been detected at the timing represented by the straight line B13. With the video signal converting device shown in FIG. 5, however, since the NTSC signal is sampled at the frequency 5×4 fsc, a sampling phase (represented by the straight line B12) closer to 0A4 (HEX) can be detected. Therefore, it is possible to realize a proper sampling phase in each one-line period for converting the NTSC signal into a proper D2 signal.

The sampling timings shown in FIGS. 7A and 7B are shown for illustrative purpose only, and do not match an actual sampling scale.

Referring back to FIG. 5, the sampling number counter 17 counts digital values of the NTSC signal that are output from the sampling point switcher 16. The sampling number counter 17 resets the count to zero at the sampling phase determined by the horizontal synchronizing signal negative-going-edge phase detector 15. Specifically, the sampling number counter 17 counts digital values in a one-line period by counting digital values from the sample number 785 to the sample number 784.

The data interpolator/omitter 18 corrects the number of digital value samples in a one-line period, which tends to vary due to jitter or the like, such that the number of samples will be equalized to 910 according to the STPTE 244M standards. A one-line period ranges from the sample number 768 to the sample number 767. The sampling number counter 17 counts digital values in a one-line period by counting digital values from the sample number 785 to the sample number 784. If the count of the sampling number counter 17 is smaller than 910, then the data interpolator/omitter 18 interpolates the digital value at the point of the sample number 767 (the end of a one-line period) which is 17 data prior to the sample number 784 (the negative-going edge of the horizontal synchronizing signal). If the count of the sampling number counter 17 is greater than 910, then the data interpolator/omitter 18 omits the data at the point of the sample number 767 which is 17 data prior to the sample number 784.

Correction of the number of samples in a one-line period as performed by the data interpolator/omitter 18 will be described in detail below.

Figure 8:
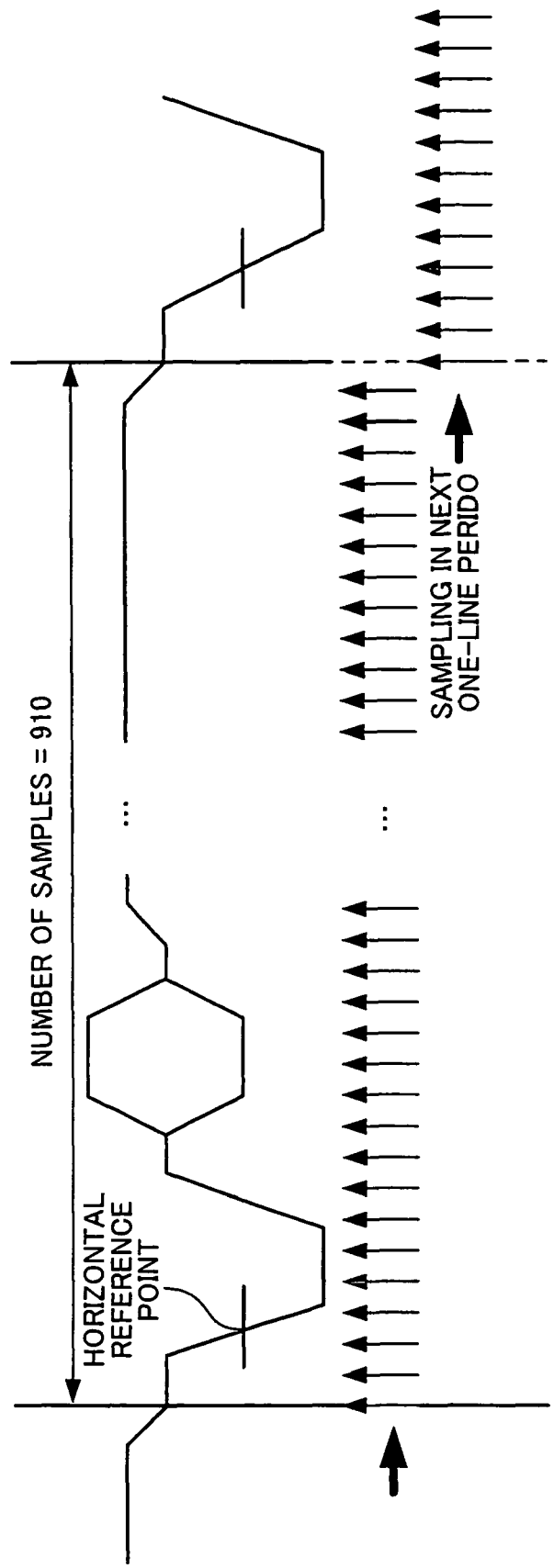
FIG. 8 is a diagram showing how a data interpolator/omitter operates when the number of samples in a one-line period is 910.

FIG. 8 shows how the data interpolator/omitter 18 operates when the number of samples in a one-line period is 910. As shown in FIG. 8, if the number of digital values in a one-line period is 910, then the STPTE 244M standards are satisfied. Therefore, the data interpolator/omitter 18 does not correct the number of sampled digital values, but outputs the digital values from the sampling point switcher 16 to the TRS-ID inserter 19.

Figure 9:
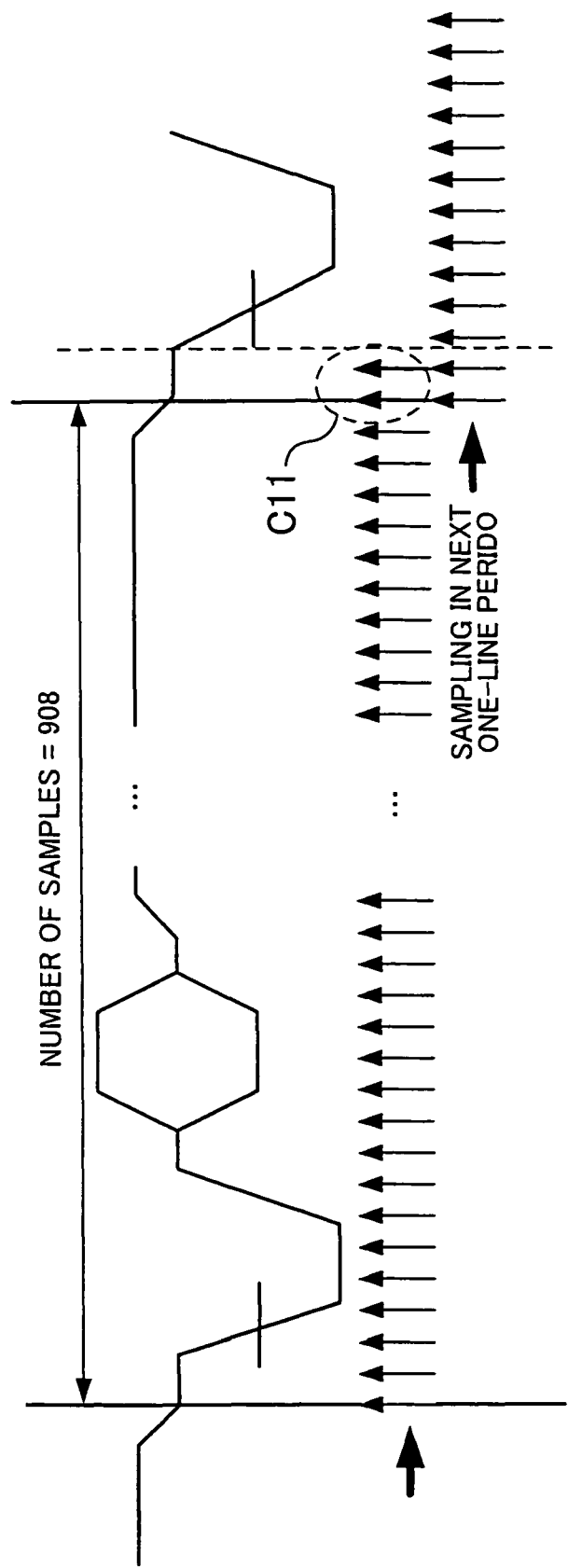
FIG. 9 is a diagram showing how the data interpolator/omitter operates when the number of samples in a one-line period is smaller than 910.

FIG. 9 shows how the data interpolator/omitter 18 operates when the number of samples in a one-line period is smaller than 910. As shown in FIG. 9, if the number of digital values in a one-line period is 908, which is smaller than 910, then the STPTE 244M standards are not satisfied. In this case, the data interpolator/omitter 18 holds two samples of previous digital values indicated by a dotted-line circle C11 and outputs the sampled digital values to the TRS-ID inserter 19. As a result, the number of sampled digital values in the one-line period becomes 910, and satisfies the STPTE 244M standards.

Figure 10:
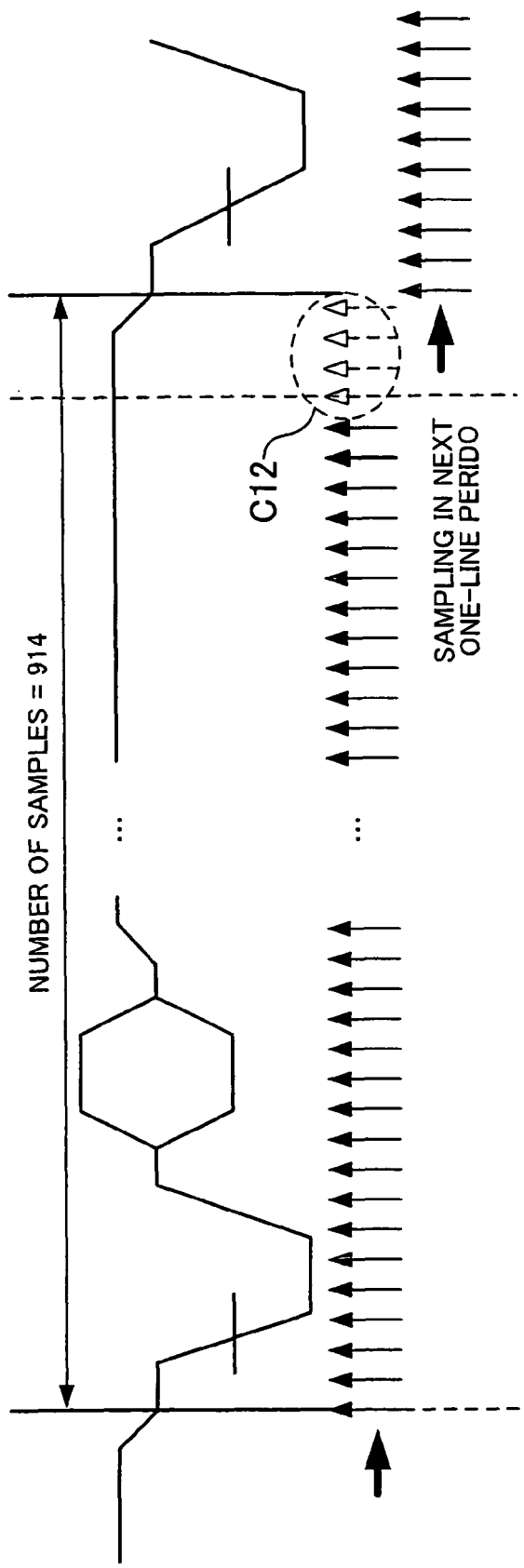
FIG. 10 is a diagram showing how the data interpolator/omitter operates when the number of samples in a one-line period is greater than 910.

FIG. 10 shows how the data interpolator/omitter 18 operates when the number of samples in a one-line period is greater than 910. As shown in FIG. 10, if the number of digital values in a one-line period is 914, which is greater than 910, then the STPTE 244M standards are not satisfied. In this case, the data interpolator/omitter 18 omits four samples of digital values indicated by a dotted-line circle C12 and outputs the sampled digital values to the TRS-ID inserter 19. As a result, the number of sampled digital values in the one-line period becomes 910, and satisfies the STPTE 244M standards.

As shown in FIG. 5, the TRS-ID inserter 19 is supplied with the digital values output from the data interpolator/omitter 18 and the sampling phase determined by the horizontal synchronizing signal negative-going-edge phase detector 15. Based on the determined sampling phase, the TRS-ID inserter 19 inserts a TRS-ID into the sample numbers 790 through 794.

For example, the TRS-ID inserter 19 can recognize the sample numbers 790 through 794 based on the sampling phase (sample number 784) from the horizontal synchronizing signal negative-going-edge phase detector 15. The TRS-ID inserter 19 inserts the TRS-ID into the sample numbers 790 through 794 thus recognized. The TRS-ID inserter 19 outputs the digital signal with the TRS-ID inserted therein as a D2 signal.

Processes of determining a sampling phase and correcting the number of samples will be described below with reference to flowcharts.

First, the process of determining a sampling phase will be described below.

Figure 11:
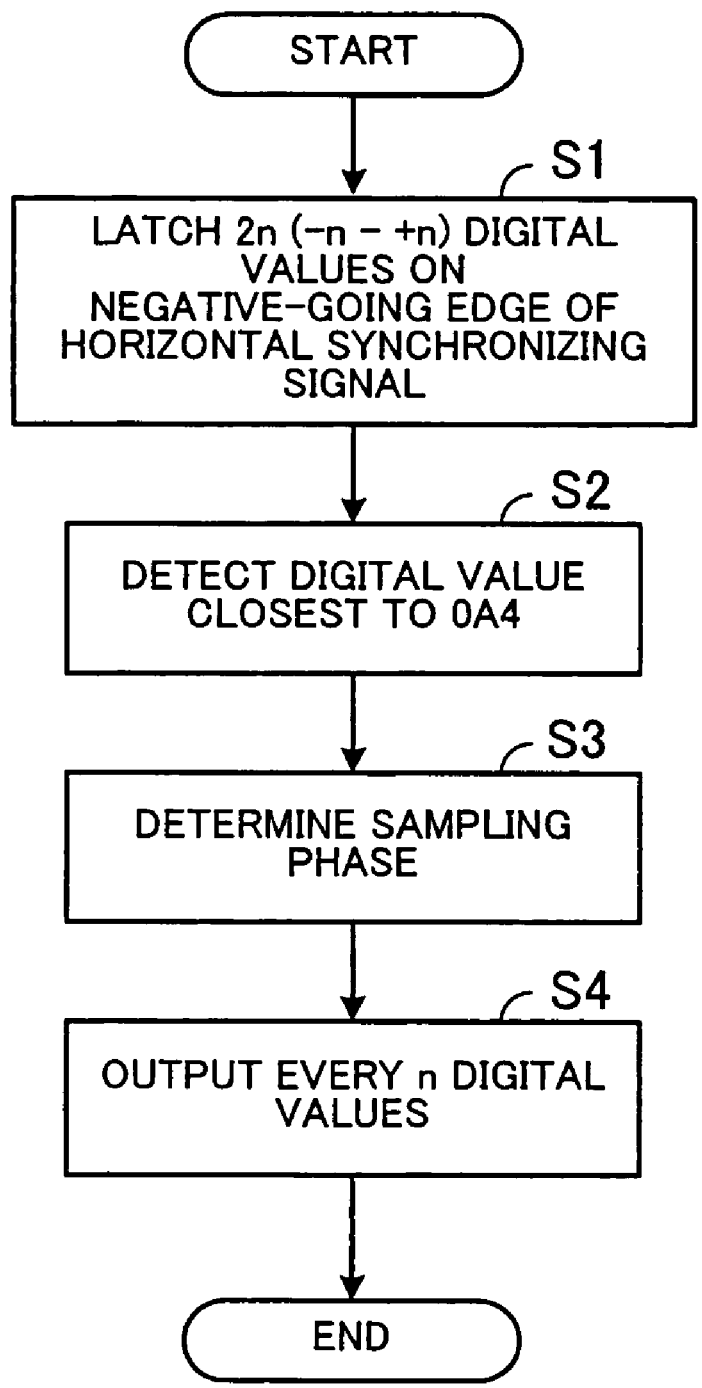
FIG. 11 is a flowchart of an operation sequence for determining a sampling phase.

FIG. 11 is a flowchart of an operation sequence for determining a sampling phase.

In step S1 shown in FIG. 11, when the horizontal synchronizing signal negative-going-edge phase detector 15 is supplied with the horizontal synchronizing signal from the synchronizing separator 14, the horizontal synchronizing signal negative-going-edge phase detector 15 latches $2n$ ($-n$ through $+n$) digital values output from the A/D converter 13. Specifically, the horizontal synchronizing signal negative-going-edge phase detector 15 latches digital values of the NTSC signal on the negative-going edge of the NTSC signal.

In step S2, the horizontal synchronizing signal negative-going-edge phase detector 15 detects a digital value the closest to the value of 0A4 (HEX) from the latched digital values.

In step S3, the horizontal synchronizing signal negative-going-edge phase detector 15 determines the sampling point for the digital value closest to the value of 0A4 (HEX) as a reference sampling point (sample number 784).

In step S4, the sampling point switcher 16 extracts every n digital values from the sampling phase determined by the horizontal synchronizing signal negative-going-edge phase detector 15, and outputs the extracted digital values.

The process of correcting the number of samples will be described below.

Figure 12:
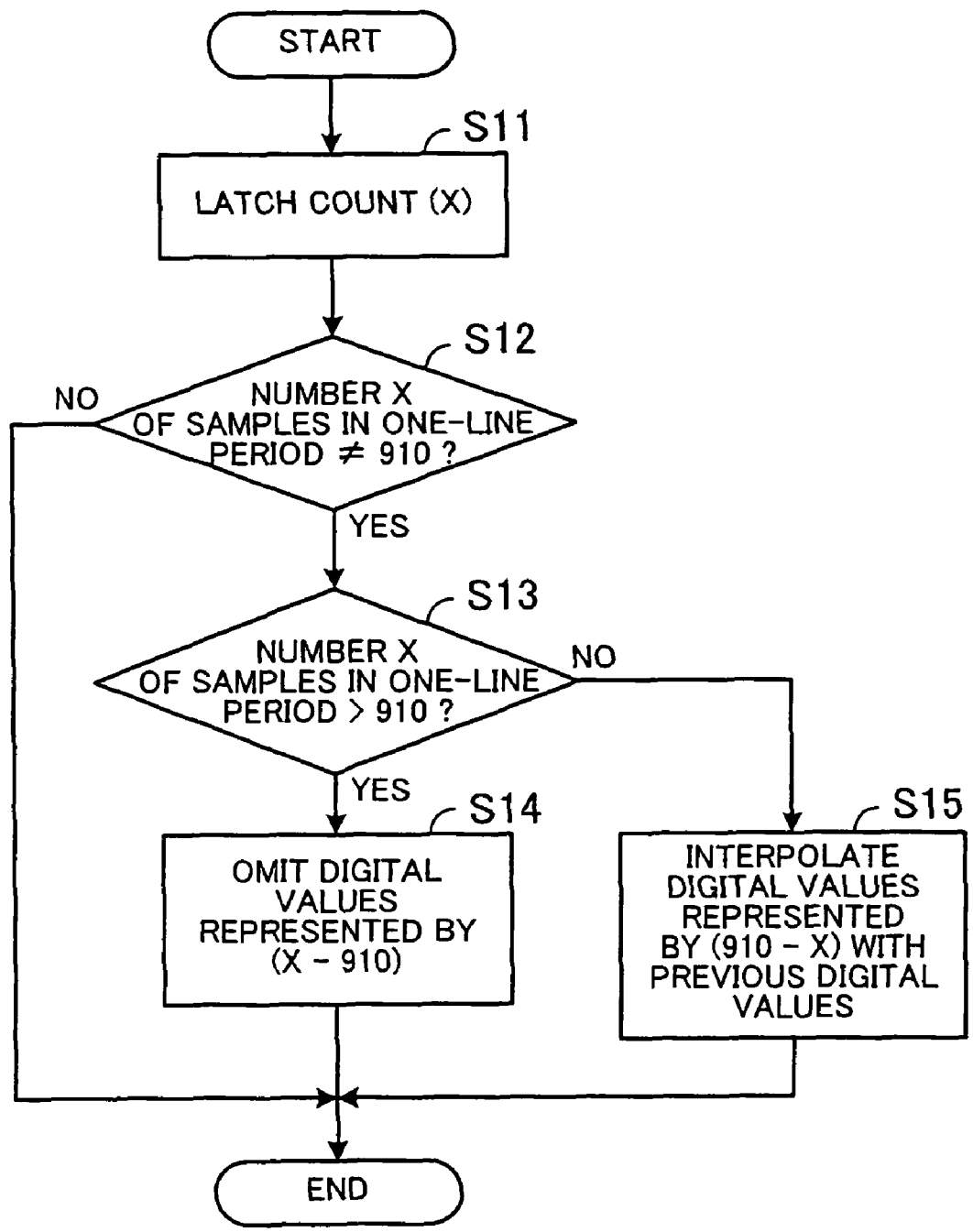
FIG. 12 is a flowchart of an operation sequence for correcting the number of samples.

FIG. 12 is a flowchart of an operation sequence for correcting the number of samples.

In step S11 shown in FIG. 12, the sampling number counter 17 latches a count (X) prior to being latched, and outputs the latched count (X) to the data interpolator/omitter 18.

In step S12, the data interpolator/omitter 18 determines whether the count of the sampling number counter 17 is 910 or not. Specifically, the data interpolator/omitter 18 determines whether the number of samples in a one-line period is 910 according to the STPTE 244M standards or not. If the count represents 910, then the data interpolator/omitter 18 does not correct the data, and the operation sequence is put to an end. If the count does not represent 910, then control goes to step S13.

In step S13, the data interpolator/omitter 18 determines whether the count of the sampling number counter 17 is greater than 910 or not. If the count of the sampling number counter 17 is greater than 910, then control goes to step S14. If the count of the sampling number counter 17 is not greater than 910, then control goes to step S15.

In step S14, the data interpolator/omitter 18 omits digital values represented by (X−910).

In step S15, the data interpolator/omitter 18 interpolates digital values represented by (910−X) with previous digital values.

As described above, an analog NTSC signal is converted into a digital signal based on a clock signal having a frequency which is represented by 4n times the frequency of the burst signal contained in the analog NTSC signal. Even if the cycle time of a one-line period varies due to jitter, since the composite signal is sampled at 4n times the frequency of the burst signal, a proper sampling phase is provided for converting the NTSC signal into a proper digital signal.

Jitter may be eliminated by a video signal correcting device such as a timebase corrector, a frame synchronizer, or the like. However, such a video signal correcting device tends to cause a large delay as it processes video data frame by frame. Since the video signal converting device according to the present invention converts an analog NTSC signal into a digital signal based on a clock signal having a frequency which is represented by 4n times the frequency of the burst signal, the video signal converting device can correct the sampling phase in each one-line period and hence can convert an analog NTSC signal into a proper digital signal with a small delay.

Even if the number of samples of a D2 signal varies due to jitter, the data interpolator/omitter 18 corrects the number of samples according to the SMPTE 244M standards. The video signal converting device can therefore output a D2 signal containing the proper number of samples.

The video signal converting device according to the present invention converts an analog composite signal into a digital signal based on a sampling clock signal having a frequency which is represented by 4n times the frequency of the burst signal contained in the analog composite signal. Consequently, even if the cycle time of a one-line period varies due to jitter, causing the sampling phase to vary, since the composite signal is sampled at 4n times the frequency of the burst signal, a proper sampling phase is provided in each one-line period for converting the composite signal into a proper digital signal.

The foregoing is considered as illustrative only of the principles of the present invention. Further, since numerous modification and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A video signal converting device for converting an analog composite signal into a digital signal, comprising:

a sampling clock output unit to output a sampling clock signal having a frequency which is 4n times the frequency of a burst signal contained in said analog composite signal (n represents a positive integer of 2 or greater);

an analog-to-digital converter to convert said analog composite signal into a digital signal based on said sampling clock signal; and a digital signal extracting unit to extract every n digital values from a predetermined sampling phase of digital values output from said analog-to-digital converter, and output the extracted digital values;

wherein said digital signal extracting unit comprises:
- a negative-going-edge detecting unit to detect a negative-going edge of a horizontal synchronizing signal of said analog composite signal;
- a comparing unit to compare the digital values on the negative-going edge of the horizontal synchronizing signal with a sampling phase determining value; and
- a sampling phase determining unit to determine said sampling phase based on the result of the comparison from said comparing unit.

2. A video signal converting device for converting an analog composite signal into a digital signal, comprising:

a sampling clock output unit to output a sampling clock signal having a frequency which is 4n times the frequency of a burst signal contained in said analog composite signal (n represents a positive integer of 2 or greater):

an analog-to-digital converter to convert said analog composite signal into a digital signal based on said sampling clock signal;

a digital signal extracting unit to extract every n digital values from a predetermined sampling phase of digital values output from said analog-to-digital converter, and output the extracted digital values; and a sample number correcting unit to correct the number of samples as the digital values output from said digital signal extracting unit so as to be equal to a predetermined number in a one-line period of said analog composite signal;

wherein said sample number correcting unit holds and outputs previously sampled digital values if the number of samples is smaller than said predetermined number, and deletes digital values if the number of samples is greater than said predetermined number.

* * * * *